US006674944B2

(12) United States Patent
Lundqvist

(10) Patent No.: US 6,674,944 B2
(45) Date of Patent: Jan. 6, 2004

(54) WAVEGUIDE COUPLER MODULATOR

(75) Inventor: Lennart P. O. Lundqvist, Kista (SE)

(73) Assignee: Altitun AB, Jarfalla (SE)

( * ) Notice: Subject to any disclaimer, the term of this patent is extended or adjusted under 35 U.S.C. 154(b) by 0 days.

(21) Appl. No.: 09/949,595

(22) Filed: Sep. 10, 2001

(65) Prior Publication Data

US 2003/0048992 A1 Mar. 13, 2003

(51) Int. Cl.[7] .............................. G02B 6/26; G02B 6/34
(52) U.S. Cl. ................... 385/50; 385/37; 385/2
(58) Field of Search ..................... 385/50, 40, 37, 385/2

(56) References Cited

U.S. PATENT DOCUMENTS

| | | | | |
|---|---|---|---|---|
| 6,118,908 A | * | 9/2000 | Bischel et al. | 385/14 |
| 6,473,541 B1 | * | 10/2002 | Ho | 385/15 |
| 6,501,875 B2 | * | 12/2002 | Zhao et al. | 385/30 |
| 2001/0026669 A1 | * | 10/2001 | Nashimoto | 385/129 |
| 2001/0031122 A1 | * | 10/2001 | Lackritz et al. | 385/131 |
| 2002/0028040 A1 | * | 3/2002 | Tseng et al. | 385/30 |
| 2002/0136494 A1 | * | 9/2002 | Yazaki et al. | 385/37 |
| 2003/0059147 A1 | * | 3/2003 | Berini | 385/2 |

* cited by examiner

Primary Examiner—Michael C. Zarroli
(74) Attorney, Agent, or Firm—Altera Law Group, LLC

(57) ABSTRACT

The output beam from a laser may be modulated using a coupled waveguide modulator that may be endfire coupled to the laser, or integrally formed on a common substrate with the laser, thereby providing a monolithic laser/modulator system that may manufactured using a high-volume semiconductor manufacturing process. The coupled waveguide modulator includes a substrate having a coupler region and an output region. A first waveguide on the substrate is parallel to an optical axis. A second waveguide is formed proximate the first waveguide, is parallel to the optical axis, and is separated from the first waveguide by a coupling distance in at least the coupler region. The second waveguide is nonparallel to the optical axis and separated from the first waveguide by at least the coupling distance in at least part of the output region.

36 Claims, 3 Drawing Sheets

WAVEGUIDE COUPLER MODULATOR

FIELD OF THE INVENTION

The present invention is directed generally to an optical device, and more particularly to devices for producing a modulated light beam in response to an applied signal.

BACKGROUND

Optical communications systems commonly transfer information from a transmitting unit to a receiving unit via an optical fiber or free-space link. The information is typically encoded on an optical carrier by modulating its amplitude, phase and/or frequency.

A modulated optical beam may be generated by changing the junction current of a semiconductor laser or by externally modulating the beam from a continuous wave (CW) laser. Direct current modulation typically changes the frequency and the amplitude of a semiconductor laser output beam. External modulation only changes the amplitude or phase of the output beam, allowing the laser frequency to be tuned independently of the modulation.

External modulators are commonly used in dense wavelength division multiplexed (DWDM) communications systems that combine a number of single-frequency signals to form a multi-channel signal that can be transported by a single optical fiber. To maintain the fidelity of each signal, the frequency of each transmitter is stabilized to an assigned channel frequency. For example, the International Telecommunications Union has established standards for dense wavelength division multiplexed (DWDM) communication signals near 1.5 µm that assign adjacent channels to optical frequencies that are separated by a fixed frequency difference of 50 GHz or 100 GHz. DWDM laser transmitters are typically stabilized to a small fraction of the interchannel spacing (typically 3 GHz) over periods of months or years. This is facilitated by the use of an externally modulated laser transmitter in which the frequency of the output is not affected by modulation.

Laser/modulator systems for use in DWDM and other applications advantageously combine long-term frequency stability and modulation fidelity in a compact package that is long-lived and insensitive to environmental noise. In the ideal case, the device should be also be manufacturable using a low-cost volume manufacturing process. In certain DWDM applications, it is also advantageous to tune the output of an externally modulated laser transmitter from one channel to another in response to an input signal. This may be accomplished by synchronously tuning the laser and modulator.

External modulators are often optically coupled to a semiconductor laser with a lens or alternative optical focusing system. An externally modulated laser assembly must, therefore, provide for the mounting and alignment of these components. In many cases, the mounting structure must also be stable with respect to temperature and vibration over long periods of time. This is difficult to achieve in a low-cost, volume-manufacturable package.

SUMMARY OF THE INVENTION

Generally, the present invention relates to a device for the modulation of a light beam, typically a light beam generated by a tunable semiconductor laser. Conventional modulators are often coupled to a semiconductor laser using an optical coupling system. This approach limits the manufacturability, cost and robustness of the laser/modulator assembly.

According to the present invention, the output of a semiconductor laser may be modulated using a coupled waveguide modulator that may be endfire coupled, also referred to as butt coupled, to the laser. The modulator may also be formed on a common substrate with the laser, thereby providing a monolithic laser/modulator system that may manufactured using a high-volume semiconductor manufacturing process. The environmental noise immunity of the system is improved significantly by eliminating the coupling optical assembly.

One particular embodiment of the invention is directed to and optical device that includes a substrate having a coupler region and an output region and a first waveguide on the substrate parallel to an optical axis. A second waveguide is formed proximate the first waveguide, is parallel to the optical axis, and is separated from the first waveguide by a coupling distance in at least the coupler region. The second waveguide is nonparallel to the optical axis and separated from the first waveguide by at least the coupling distance in at least part of the output region.

Another embodiment of the invention is directed to an optical device that includes a laser and a substrate, the substrate having a coupler region and an output region and a first waveguide on the substrate parallel to an optical axis and that is coupled to the laser. A second waveguide is formed proximate the first waveguide and is parallel to the optical axis and separated from the first waveguide by a coupling distance in at least the coupler region. An input to one of the first and second waveguides is optically coupled to receive an output from the laser. The second waveguide is nonparallel to the optical axis and separated from the first waveguide by at least the coupling distance in at least part of the output region.

Another embodiment of the invention is directed to an optical communications system that includes a transmitting unit, a receiving unit and an optical transport system. The transmitting unit generates an optical information signal that is carried to the receiving unit by the optical transport system. At least one of the transmitting unit, the receiving unit and the optical transport system have at least one optical device that includes a substrate having a coupler region and an output region, with a first waveguide on the substrate parallel to an optical axis. A second waveguide is formed proximate the first waveguide, parallel to the optical axis, and separated from the first waveguide by a coupling distance in at least the coupler region. The second waveguide is nonparallel to the optical axis and is separated from the first waveguide by at least the coupling distance in at least part of the output region.

Another embodiment of the invention is directed to an optical communications system that includes a transmitting unit, a receiving unit and an optical transport system. The transmitting unit generates an optical information signal propagating to the receiving unit through the optical transport system. At least one of the transmitting unit, the receiving unit and the optical transport system has at least one optical device that includes a laser and a substrate having a coupler region and an output region. A first waveguide on the substrate is parallel to an optical axis and a second waveguide formed proximate the first waveguide is parallel to the optical axis and is separated from the first waveguide by a coupling distance in at least the coupler region. The second waveguide is nonparallel to the optical axis and is separated from the first waveguide by at least the coupling distance in at least part of the output region.

Another embodiment of the invention is directed to a method for modulating a light beam that includes coupling light to a first waveguide formed on a substrate with a coupler region and an output region, the first waveguide being parallel to an optical axis, and transferring light from the first waveguide to a second waveguide proximate the first waveguide in the coupler region. A current is controlled through the first waveguide and the second waveguide to control an amount of light coupled from the first waveguide to the second waveguide. The coupled light in the second waveguide is directed in a direction that is nonparallel to the optical axis in at least part of the output region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
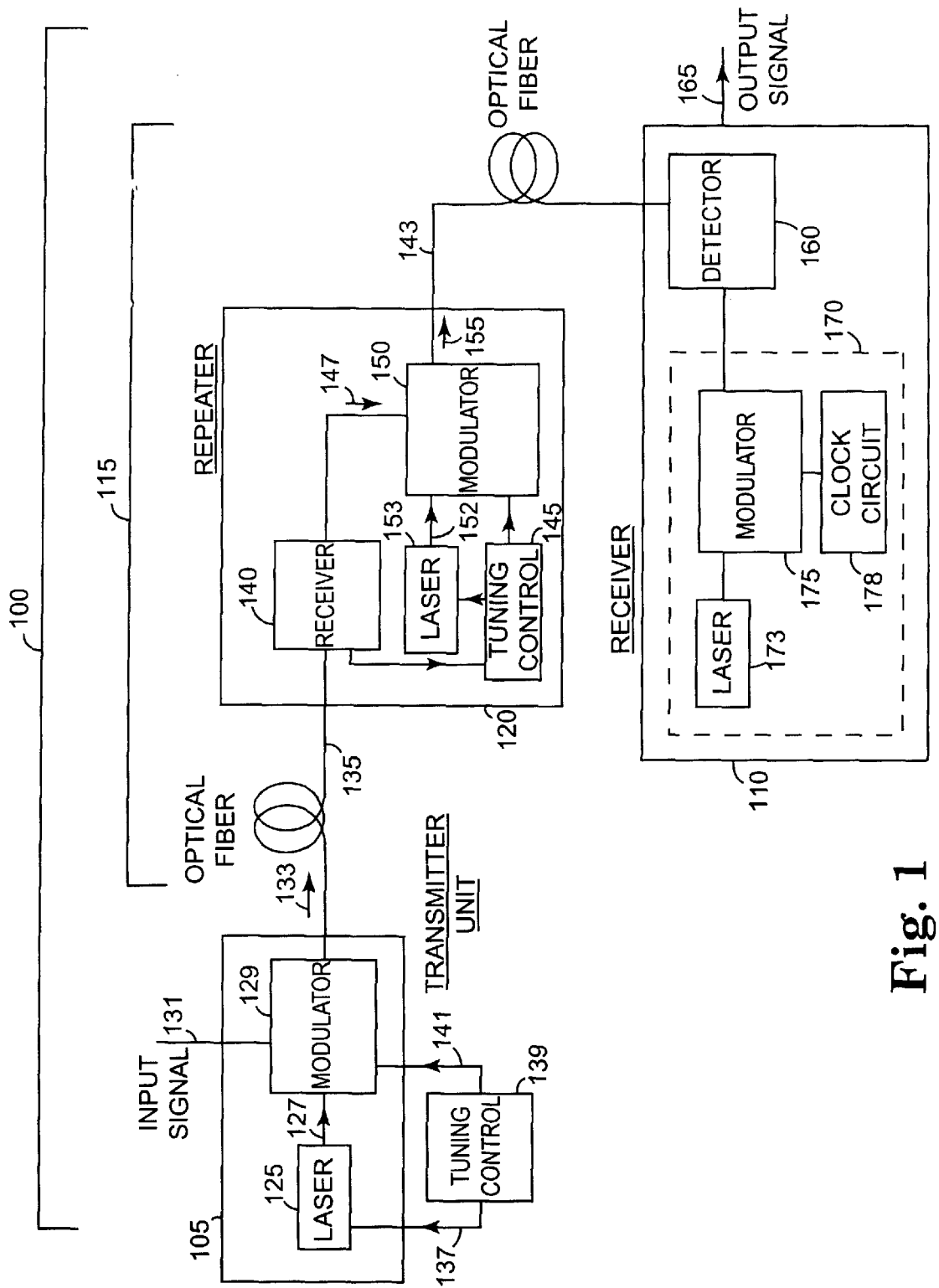
FIG. 1 schematically illustrates a tunable laser communications system.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Optical communications systems typically carry optical information signals in the form of modulated light beams from a transmitter unit to a receiver unit. In a representative example of generating an optical communications signal, the junction current of a semiconductor laser may be modulated in response to an input signal, thereby changing the amplitude of the laser output beam. The laser output beam may travel through free space, an optical fiber, or an alternative transport system to a receiving unit. At the receiving unit, the modulated light beam is incident on a detector that recovers the information from the optical signal.

If only one channel is transported from the transmitting unit to the receiving unit, there is little need to stabilize the frequency of the laser transmitter. Optical detectors are sensitive over a wide range of frequencies and can efficiently detect an amplitude modulated light beam even if the frequency of the light is chirped during the modulation cycle.

In cases where a number of single-frequency channels are carried by a single optical fiber, the individual channel frequencies are typically fixed according to a standard. For example, in the ITU standard for 1.5 µm DWDM communications systems, adjacent channels are separated by a fixed frequency difference of 50 GHz or 100 GHz. The frequencies of the individual channels are typically stabilized to 3 GHz over an extended period of time.

Laser transmitter units for use in DWDM communications systems often have single-channel transmitters that include a single frequency laser and an external modulator. Typically, the single-frequency laser is stabilized to one of the channel frequencies and the modulator encodes information on the laser output. Lasers with fixed output frequencies typically incorporate one or more distributed grating structures within the laser cavity and are tunable over a small frequency range by variation of the junction current and/or temperature.

External laser modulators may be optimized for a particular light frequency or may operate over a comparatively wide frequency range. In some cases, modulators with a comparatively narrow modulation response function may be tuned with an external signal. Tunable modulators are often used in systems where it is desirable to tune a laser transmitter over a range of frequencies, for example, across several, if not all, of the channels of a DWDM communications system. By coupling a tunable semiconductor laser and a tunable external rhodulator, optical signals may be generated across a wide frequency range.

FIG. 1 schematically illustrates a laser communication system 100 that may be tunable. In the system 100, a single-frequency optical signal is generated by the transmitter unit 105 and carried to the receiver unit 110 by the optical transport system 115. The optical transport system may include one or more optical repeaters 120. A single-frequency laser 125, which may be a tunable semiconductor laser, generates a single-frequency light beam 127. The modulator 129 changes the amplitude and/or phase of the laser beam 127 according to the input signal 131, thereby generating an optical information signal 133 that is coupled into the optical fiber 135.

The frequency of the laser 125 may optionally respond to the laser tuning signal 137 from the tuning control unit 139 and the frequency dependence of the modulator transfer function may be optionally tuned by the modulator tuning signal 141 from the tuning control unit 139. Tunable operation is advantageous in a dense wavelength division multiplexed (DWDM) communications system where the outputs of several lasers with different output wavelengths are combined into a multichannel signal by a wavelength division multiplexer (MUX): one type of tunable laser may be used as the source for light at several optical channel frequencies, rather than requiring many different, fixed frequency lasers for respective optical channels. Furthermore, tunable lasers are useful as backup lasers to replace lasers in transmitter units that have failed. Rather than having one or more fixed wavelength back-up lasers for each optical channel, a tunable back-up laser may be tuned to the channel frequency of a laser that has failed. Consequently, the laser back-up system may be more flexible when tunable lasers are used. Additional lasers and a MUX may be included in the transmitter unit 105.

The optical transport system 115 carries the signal 133 from the fiber optic 135 to the optical fiber 143. In the simplest case, the two optical fibers 135, 143 may be spliced together without a repeater or may be portions of a single optical fiber. One or more optical amplifiers (not shown in FIG. 1) may be positioned along the fiber 125 to increase the strength of the signal 133 as it travels through the optical transport system 115.

Optionally, one or more repeaters 120 may be inserted in the transport system 115 to increase signal strength and/or change the frequency of the signal. The repeater 120 includes a receiver 140 that converts the optical signal 133 to a modulator control signal 147. The phase and/or amplitude of the output beam 152 from the single frequency laser 153 is modulated according to the modulator control signal 147 by the modulator 150. The frequency of the laser 153 may be tunable in response to a signal from the tuning control 145 and may optionally be different from the laser 125.

The repeater output signal 155 (or, in the absence of a repeater, the transmitter output signal 133) is transported to the receiver 110 by the fiber optic 143. A detector 160 in the receiver unit 110 typically converts the optical information signal 155 (or the optical information signal 133 if there is no repeater) to an output signal 175. In certain cases, it may be advantageous to modulate the detector response function in such a way that the detector sensitivity is maximized during intervals when an optical information signal is expected and minimized at other times. The detector response may, optionally, be modulated by an optical signal.

In the receiver unit of FIG. 1, the detector sensitivity is modulated by an optical clock signal 167 from the optical clock unit 170. The optical clock unit 170 includes a laser 173 that may be a single frequency laser and a modulator 175 that modulates the laser output beam in response to signals from the clock circuit 178.

In a DWDM communications system, each channel typically utilizes a dedicated transmitter/receiver pair that is tuned to the particular channel frequency. Modulated output beams from multiple transmitter units may be combined using a MUX at the transmitting station and separated using a demultiplexer (DMUX) at the receiving station.

In the communications system 100, externally modulated lasers 125, 153 and 173 are used in the transmitter unit 105, the repeater 120, and the receiver 110. In one particular embodiment of the transmitter unit 105, the output beam 127 from the laser 125 may be coupled to the modulator 129 with an optical coupling system that is not shown in FIG. 1. The optical coupling system may be used when the design of the laser 125 and the modulator 129 do not facilitate direct endfire coupling of the two components.

If an optical coupling system is used to couple the output 127 of the laser 125 to the modulator 129, the individual components are typically aligned to tight tolerances. In many cases, the alignment tolerances are maintained over the life of the externally modulated laser assembly, which, in the case of a telecommunications system, may be several years. Those skilled in the art will appreciate the difficulties of aligning an optical system to couple the output beam from a semiconductor laser diode to a guided-wave optical modulator and that the difficulties are increased when designing a package that maintains the alignment over a period of years. Environmental noise in the form of vibration and temperature excursions may adversely affect the alignment of the coupling optical system and external isolation techniques are often required to minimize the environmental noise amplitude.

Integrated assemblies in which the modulator and laser are end-fire coupled can significantly simplify the design of an externally modulated laser assembly. In addition to decreasing the package complexity by eliminating the coupling optical system, an end-fire coupled, externally-modulated laser is easier to stabilize against vibration and temperature fluctuations. Integration of the laser and modulator on a single substrate (monolithic design) provide additional advantages by eliminating the alignment process and reducing the size of the externally modulated laser package. Monolithic devices may also be easily stabilized against temperature fluctuations.

One embodiment of the present invention is a coupled waveguide modulator that can be end-fire coupled to a semiconductor laser diode. Another embodiment is a modulated laser in which the laser and coupled waveguide modulator are formed on the same substrate. The modulation response function of the invention may be tunable and both embodiments are may be used to modulate the output of a tunable semiconductor laser.

Figure 2A:
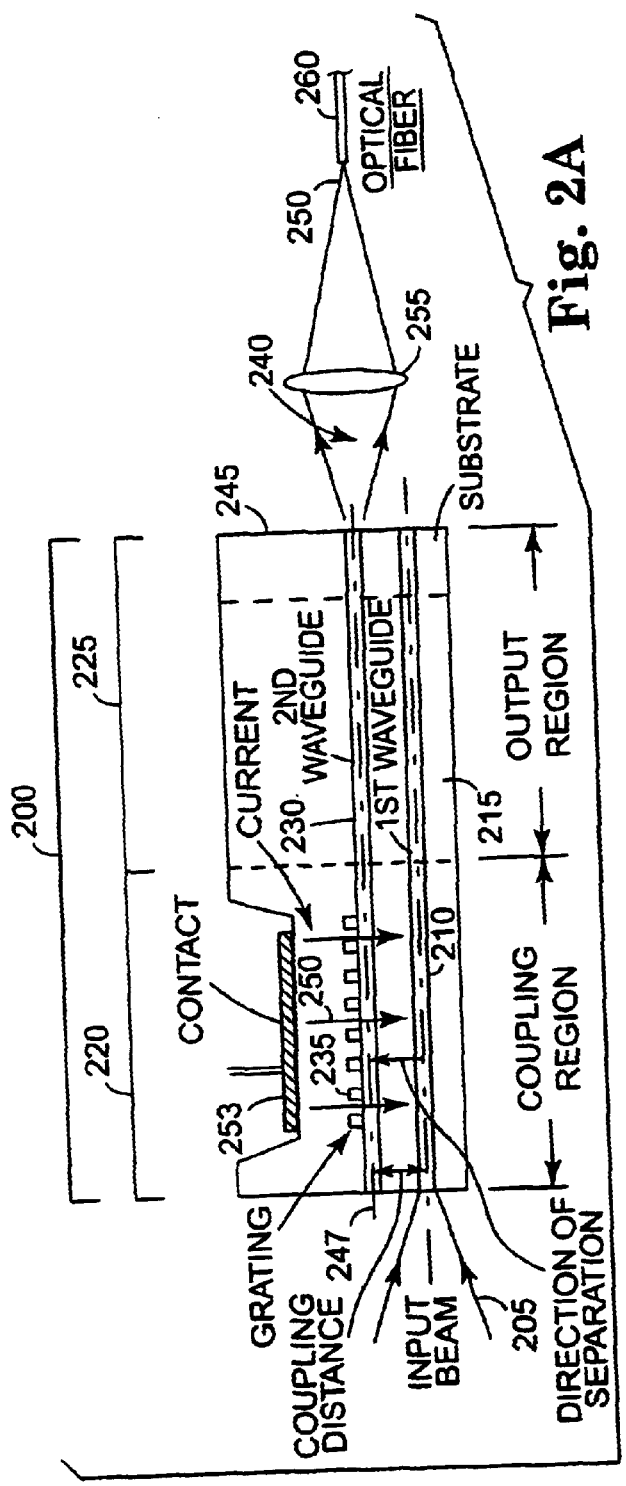
FIGS. 2A and 2B schematically illustrate a tunable coupler modulator according to the present invention.
Figure 2B:
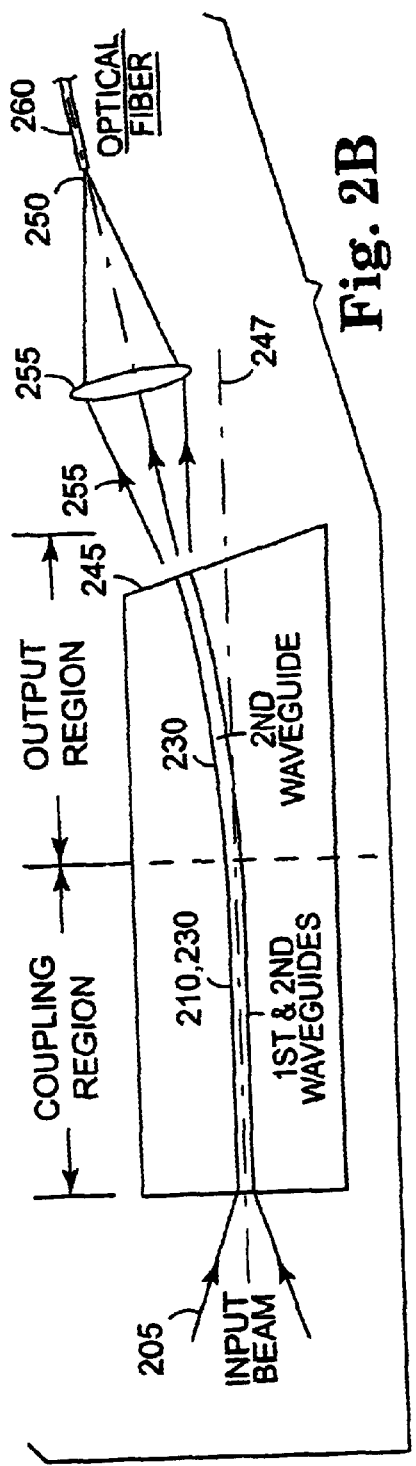

FIGS. 2A and 2B show schematic representations of a coupled waveguide modulator 200 according to the current invention. FIG. 2A shows a side view and FIG. 2B shows a top view. An input beam 205 may be coupled to an input waveguide 210 that is typically formed on the substrate 215. The input waveguide 210 may be a two-dimensional, integrated optic waveguide in a first, coupling region 220 of the modulator and a planar waveguide in a second, output region 225. The term "two-dimensional" as applied to waveguides indicates that the waveguide confines light in two dimensions orthogonal to the direction of propagation along the waveguide. In other words, the two-dimensional waveguide confines light both horizontally and vertically. A planar, one dimensional waveguide provides confinement only in one direction, usually the vertical direction relative to the substrate.

In the coupling region 220, a second, two-dimensional waveguide 230 may be formed over the first waveguide 210. The optical coupling between the first waveguide 210 and the second waveguide 230 may also be enhanced by forming a distributed grating 235 in close proximity to at least one of the first and second waveguides 210 and 230. For example, the grating 235 may be formed on top of the second waveguide 230. The grating 235 is typically most efficient at enhancing the coupling between the first waveguide 210 and the second waveguide 230 over a range of frequencies.

In the output region 225, the second waveguide 230 may be curved to direct light in an output direction 240 at the output facet 245. An optical axis 247 is defined to be coincident with the second waveguide 230 in the coupling region 220, the output direction 240 is typically angled with respect to the axis 247 in a plane parallel to the substrate 215.

A current 250 may be applied to the coupling region by connecting a current source to the contact 253. The current 250 may have two components, a modulation component and a tuning component. When the modulation component flows through the first waveguide 210 and the second waveguide 230, light is typically transferred from the first waveguide 210 to the second waveguide 230. Light that is transferred to the second waveguide 230 in the coupling region propagates through the output region 225 and exits the modulator as an output beam 255 at the output facet 245. By varying the current in response to an external signal, an optical output signal may be generated at the output facet.

Light in the first waveguide 210 is typically guided in a single dimension perpendicular to the substrate 215 by a planar waveguide as it travels through the output region 225. In the absence of a modulation current, the input light propagates in the first waveguide 210. When the modulation current is increased, an increasing fraction of the input light is transferred to the second waveguide 230 until almost all of the light is transferred from the first waveguide 210 to the second waveguide 230.

Because the first waveguide 210 may be a planar waveguide in the output region 225, the intensity of light propagating in the first waveguide typically decreases significantly at the output facet 245. It may be difficult to focus the light exiting the first waveguide 210 from the output facet 245 since the since the beam waist in the direction parallel to the substrate 215 is typically located at the junction between the coupling section 220 and the output section 225 and the waist in the orthogonal direction is located at the output facet 245. Thus, the beam exiting from the first waveguide 210 is astigmatic.

Since the waveguide 230 guides light both vertically and horizontally in the output region, the output beam 240 may be imaged at an external point 250 with a lens 255. If the end of an optical fiber 260 is positioned at location 250, a large portion of the output beam 240 may be coupled into the fiber 260 by the lens 255. Little or no light from the first waveguide 210 will typically be coupled into the fiber 260 by the lens 255 since the first waveguide 210 is a one dimensional guide in the output region and the second waveguide 230 is typically bent away from the axis 247. Thus, modulating the current 250 results in changing the amount of light coupled from the first waveguide 210 to the second waveguide 230. Hence, the power of the light coupled into the fiber 260 may be switched from a maximum value that is approximately equal to the input power to a minimum value approximating zero.

The grating 235 may increase the amount of light coupled from the first waveguide 210 to the second waveguide 230 when the modulation portion of the current 250 is flowing through the coupling region 220. The coupling enhancement due to the grating is typically dependent on the frequency of the input beam 205 and the period of the grating 235. If the input beam 205 is tuned over a wide frequency range, the maximum fraction of the input beam 205 coupled from the first waveguide 210 to the second waveguide 230 may change with the input frequency. This effect may be undesirable in many applications.

The tuning portion of the current 250 may be used to tune the grating 235, thereby reducing a variation in the maximum coupled light power with frequency. The magnitude of the tuning portion of the current 250 may change slowly in time, compared with the modulation portion of the current 250. In a typical DWDM communications application, for example, the modulator and laser may be tuned to a first channel frequency using the tuning portion of the current 250. During the period when an optical signal is transmitted using a single channel, the magnitude of the tuning portion of the current 250 typically remains constant. The optical signal is typically generated by rapidly changing the modulation portion of the current 250 during this period. A second information signal may be transmitted by the same modulator and laser on a second channel by tuning the laser to the channel frequency and changing the tuning portion of the current 250 to move the peak of the grating enhanced coupling function to the new wavelength. Typically, an optical signal is transmitted at the second frequency by changing the modulation portion of the current 250. Signals may be transmitted by the same laser and modulator at other channel frequencies by repeating the procedure.

An advantage of the modulator 200 is the ease with which it may be coupled to a semiconductor laser. Because it is a waveguide-based device, the coupler modulator may be end-fire coupled to a semiconductor laser. Conventional modulators are typically coupled to a semiconductor lasers using a coupling optical system, thereby increasing the complexity and cost of the modulated laser assembly. Furthermore, modulated lasers that incorporate coupling optical systems are typically much more sensitive to vibration and temperature fluctuations (environmental noise). In a typical communications application, for example, transmitters that include modulated lasers incorporating optical coupling systems must be carefully designed to decrease the level of environmental noise reaching the modulated laser assembly.

Figure 3:
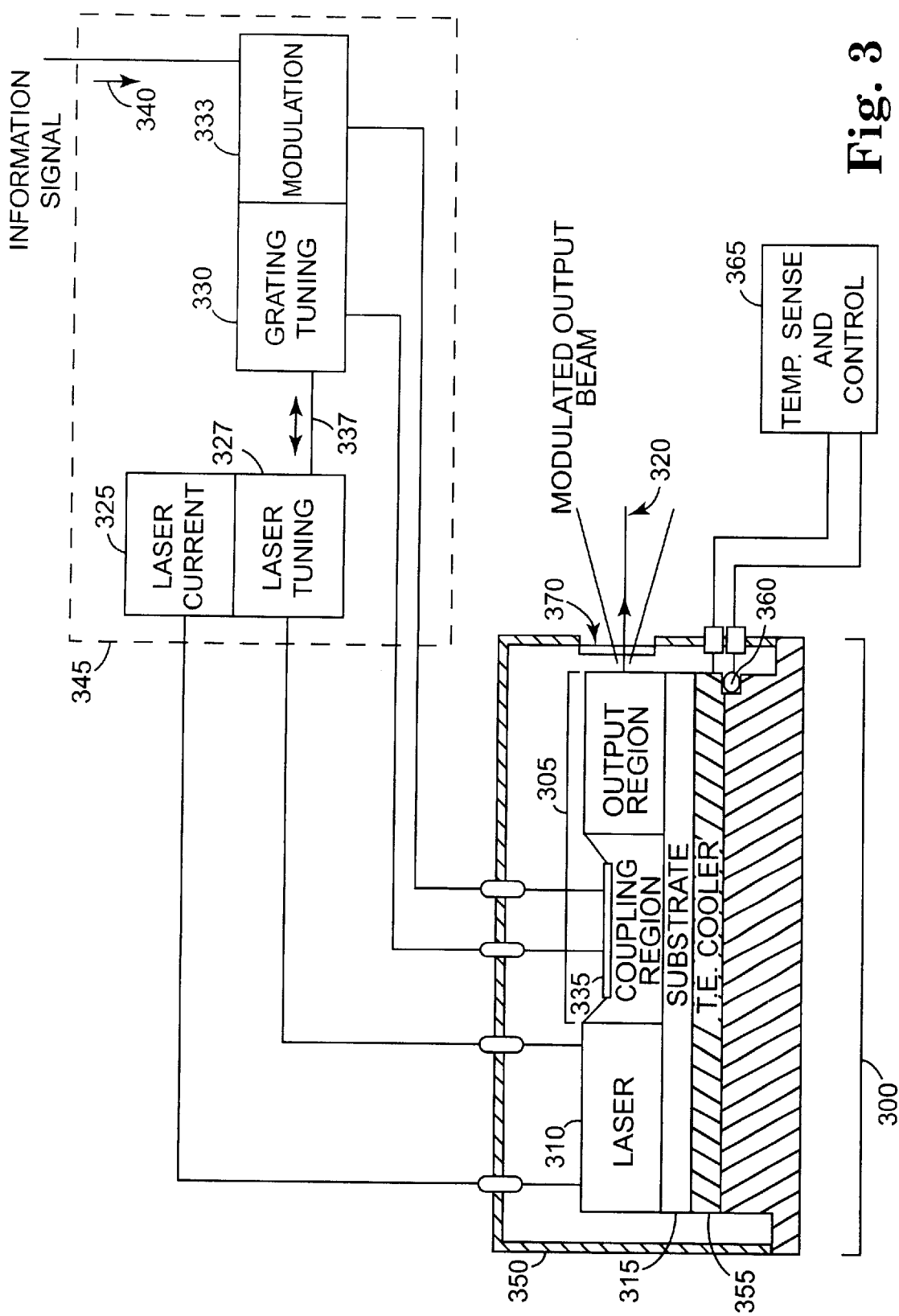
FIG. 3 schematically illustrates a modulated tunable laser system.

Further improvements in noise immunity and package cost may be achieved by integrating the modulator 200 and a tunable laser on a common substrate. FIG. 3 is a schematic representation of an integrated tunable modulated laser 300 according to the present invention. The integrated laser 300 includes a tunable semiconductor laser 310, that may be a grating coupled sampled reflector (GCSR) laser, or other type of tunable laser, and a waveguide coupler modulator 305 that is similar in design to the modulator 200. The laser 310 and modulator 305 are typically formed on a common substrate 315 with light from the laser 310 coupled to the first waveguide of the modulator 305. A modulated output beam 320 emerges from the second waveguide of the modulator 305.

A laser current supply 325 supplies current to the semiconductor laser 310, thereby controlling the output power of the laser 310. Where the laser 310 is a tunable laser, the laser output wavelength may be tuned by a signal from the laser tuning supply 327. The tuning component and the modulation component of the current supplied to the modulator may be provided by a modulator tuning supply 330 and a modulation supply 333, respectively. The modulator current is typically coupled to the coupling region of the modulator 305 by the contact 335. A link 337 may coupled the laser tuning supply 327 to the modulator grating tuning supply 330, thus allowing the laser 310 and modulator 305 to be tuned in track with each other. The modulation current generated by the modulation supply 333 is typically changed in response to an information signal 340. Optionally, the laser current supply 310, the laser tuning supply 327, the modulation supply 333 and the modulator tuning supply 330 may be combined in a externally modulated laser control unit 345.

The modulated laser 300 may be housed in a single hermetically sealed package 350 with active temperature control. An advantage of such packaging is that the modulated laser 300 is relatively immune to environmental noise. The substrate 315 of the modulated laser 300 may be mechanically and thermally joined to a thermoelectric cooler 355. The temperature of the modulated laser 300 may be measured by a temperature sensor 360, for example a thermistor, a solid state temperature sensor or a thermocouple. A temperature sensing and control unit 365 may receive a signal from the temperature sensor 360 and may adjust the current supplied to the thermoelectric cooler, thereby stabilizing the temperature of the modulated laser 300. The 'hot side' of the thermoelectric cooler 355 is typically mounted to the hermetically sealed package 350 and the package 350 may be mounted to an external heat sink (not shown). The modulated output beam 320 may be coupled from the hermetically sealed package 350 by a window 370 that may, optionally, be an antireflection coated window. Electrical feedthroughs 375 are typically used to couple electrical signals from the temperature sensing and control unit, the laser current control, the laser tuning control, the grating tuning control and/or the modulation control to the modulated laser 300. It will be appreciated that the operating wavelength of the laser 300 may also be tuned by varying the operating temperature of the laser.

As noted above, the present invention is applicable to the modulation of light beams and is particularly useful in providing a tunable, externally modulated laser for DWDM communications systems. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

I claim:

1. An optical device comprising:
a substrate having a coupler region and an output region;
a first waveguide on the substrate parallel to an optical axis;
a second waveguide formed proximate the first waveguide, the second waveguide being parallel to the optical axis and separated from the first waveguide by a coupling distance in at least the coupler region, the second waveguide being nonparallel to the optical axis and separated from the first waveguide by at least the coupling distance in at least part of the output region a direction of separation between the first waveguide and the second waveguide in the output region being nonparallel with a direction of separation between the first waveguide and the second waveguide in the coupling section.

2. An optical device as recited in claim 1, wherein a magnitude of optical coupling between the first waveguide and the second waveguide is responsive to a first portion of a current flowing through the first waveguide and the second waveguide in at least a portion of the coupler region.

3. An optical device as recited in claim 2, further comprising a grating disposed in the coupler region to enhance optical coupling between the first waveguide and the second waveguide.

4. An optical device as recited in claim 3 wherein the magnitude of the optical coupling has a wavelength dependence responsive to a second portion of the current, the second portion of the current flowing through at least a portion of the grating.

5. An optical device as recited in claim 2, further comprising a coupling control unit coupled to supply the first portion of the current to the coupler region.

6. An optical device as recited in claim 1, wherein, in the output region, the first waveguide is a one-dimensional waveguide and the second waveguide is a two-dimensional waveguide.

7. An optical device as recited in claim 1, wherein the substrate has an output facet and an input facet and the output facet is nonparallel to the input facet.

8. An optical device as recited in claim 1, wherein light propagating in the first waveguide exits the output region in a first direction and light propagating in the second waveguide exits the output region in a second direction different from the first direction.

9. An optical device, comprising:
a laser formed on a substrate having a coupler region and an output region;
a first waveguide on the substrate parallel to an optical axis and coupled to the laser; and
a second waveguide formed proximate the first waveguide, the second waveguide being parallel to the optical axis and separated from the first waveguide by a coupling distance in at least the coupler region, an input to one of the first and second waveguides being optically coupled to receive an output from the laser, the second waveguide being nonparallel to the optical axis and separated from the first waveguide by at least the coupling distance in at least part of the output region, a coupling coefficient between the first waveguide and the second waveguide being responsive to a first signal applied to the coupling region.

10. An optical device as recited in claim 9, wherein the first applied signal is generated by a modulation control unit.

11. An optical device as recited in claim 9, comprising a grating disposed in the coupler region to enhance optical coupling between the first waveguide and the second waveguide.

12. An optical device as recited in claim 11 wherein an optical coupling coefficient for optical coupling between the first and second waveguides has a wavelength dependence responsive to a portion of the first applied signal.

13. An optical device as recited in claim 12, wherein the wavelength of the laser is responsive to a second applied signal.

14. An optical device as recited in claim 13, further comprising a control unit that generates the first and second applied signals.

15. An optical device as recited in claim 9, wherein the laser is a tunable laser.

16. An optical device as recited in claim 15 wherein the wavelength of the tunable laser is responsive to a laser tuning signal.

17. An optical device as recited in claim 16 wherein the laser tuning signal is generated by a laser wavelength control unit.

18. An optical communications system, comprising:
a transmitting unit;
a receiving unit; and
an optical transport system, the transmitting unit generating an optical information signal that is carried to the receiving unit by the optical transport system and at least one of the transmitting unit, the receiving unit and the optical transport system including at least one optical device that includes:
a substrate having a coupler region and an output region;
a first waveguide on the substrate parallel to an optical axis; and
a second waveguide formed proximate the first waveguide, the second waveguide being parallel to the optical axis and separated from the first waveguide by a coupling distance in at least the coupler region, the second waveguide being nonparallel to the optical axis and separated from the first waveguide by at least the coupling distance in at least part of the output region.

19. An optical communications system as recited in claim 18, wherein the at least one optical device is in the transmitting unit, and is coupled to modulate an output signal from a laser source, the modulated output signal being directed to the optical transport system.

20. An optical communications system, comprising:
a transmitting unit;
a receiving unit; and
an optical transport system, the transmitting unit generating an optical information signal propagating to the receiving unit through the optical transport system and at least one of the transmitting unit, the receiving unit and the optical transport system including at least one optical device that includes;
a laser;
a substrate having a coupler region and an output region;
a first waveguide on the substrate parallel to an optical axis; and
a second waveguide formed proximate the first waveguide, the second waveguide being parallel to the optical axis and separated from the first waveguide by a coupling distance in at least the coupler region, the second waveguide being nonparallel to the optical axis and separated from the first waveguide by at least the coupling distance in at least part of the output region.

21. An optical communications system as recited in claim 20, wherein the at least one optical device generates at least a portion of the optical information signal.

22. An optical communications system as recited in claim 20, wherein the optical transport system includes a repeater unit, and the laser is disposed in the repeater unit.

23. An optical communications system as recited in claim 20, wherein the at least one optical device is disposed in the receiver unit and generates an optical clock signal.

24. A method for modulating a light beam, comprising:

coupling light to a first waveguide formed on a substrate with a coupler region and an output region, the first waveguide being parallel to an optical axis;

transferring light from the first waveguide to a second waveguide formed on the substrate proximate the first waveguide in the coupler region;

controlling a current through the first waveguide and the second waveguide to control an amount of light coupled from the first waveguide to the second waveguide; and directing the coupled light in the second waveguide in a direction that is nonparallel to the optical axis in at least part of the output region.

25. A method as recited in claim 24, including current-tuning a grating proximate the second waveguide to enhance optical coupling between the first waveguide and the second waveguide.

26. A method as recited in claim 24, including generating the current with a modulation control unit.

27. The method as recited in claim 25, including coupling light output from a tunable laser to the first waveguide.

28. The method as recited in claim 27, including tuning the laser with a laser control unit and tuning the current-tuned grating with a modulation control unit, the laser control unit and the modulation control unit exchanging tuning signals to synchronously tune the laser wavelength and the grating.

29. The method as recited in claim 28, including combining the laser control unit and the modulation control unit in a single modulated laser control unit.

30. An optical device comprising:

a substrate having a coupler region and an output region;

a first waveguide on the substrate parallel to an optical axis;

a second waveguide formed proximate the first waveguide, the second waveguide being parallel to the optical axis and separated from the first waveguide by a coupling distance in at least the coupler region, the second waveguide being nonparallel to the optical axis and separated from the first waveguide by at least the coupling distance in at least part of the output region, a magnitude of optical coupling between the first waveguide and the second waveguide being responsive to a first portion of a current flowing through the first waveguide and the second waveguide in at least a portion of the coupler region; and a grating disposed in the coupler region to enhance optical coupling between the first waveguide and the second waveguide, the magnitude of the optical coupling having a wavelength dependence responsive to a second portion of the current, the second portion of the current flowing through at least a portion of the grating.

31. An optical device comprising:

a substrate having a coupler region and an output region;

a first waveguide on the substrate parallel to an optical axis;

a second waveguide formed proximate the first waveguide, the second waveguide being parallel to the optical axis and separated from the first waveguide by a coupling distance in at least the coupler region, the second waveguide being nonparallel to the optical axis and separated from the first waveguide by at least the coupling distance in at least part of the output region, a magnitude of optical coupling between the first waveguide and the second waveguide being responsive to a first portion of a current flowing through the first waveguide and the second waveguide in at least a portion of the coupler region; and a coupling control unit coupled to supply the first portion of the current to the coupler region.

32. An optical device comprising:

a substrate having a coupler region and an output region;

a first waveguide on the substrate parallel to an optical axis;

a second waveguide formed proximate the first waveguide, the second waveguide being parallel to the optical axis and separated from the first waveguide by a coupling distance in at least the coupler region, the second waveguide being nonparallel to the optical axis and separated from the first waveguide by at least the coupling distance in at least part of the output region wherein, in the output region, the first waveguide is a one-dimensional waveguide and the second waveguide is a two-dimensional waveguide.

33. An optical device comprising:

a substrate having a coupler region and an output region, the substrate having an output facet and an input facet, the output facet being nonparallel to the input facet;

a first waveguide on the substrate parallel to an optical axis; and a second waveguide formed proximate the first waveguide, the second waveguide being parallel to the optical axis and separated from the first waveguide by a coupling distance in at least the coupler region, the second waveguide being nonparallel to the optical axis and separated from the first waveguide by at least the coupling distance in at least part of the output region.

34. An optical device comprising:

a substrate having a coupler region and an output region;

a first waveguide on the substrate parallel to an optical axis;

a second waveguide formed on the substrate, in the coupler region the second waveguide lying proximate and parallel to the first waveguide to form a coupler, in the coupler region the first and second waveguides lying in a coupling plane, in the output region the second waveguide defining an optical propagation direction non-parallel to the coupling plane a coupling coefficient between the first waveguide and the second waveguide being responsive to a first signal applied to the coupling region.

35. An optical device as recited in claim 9, wherein the first and second waveguides, in the coupler region, lie in a coupling plane, a portion of the second waveguide in the output region pointing in a direction non-parallel to the coupling plane.

36. A method as recited in claim 24, wherein controlling the current includes controlling the current passing through the first and second waveguides in the coupler region.

* * * * *